(12) United States Patent
Southard et al.

(10) Patent No.: US 9,235,498 B1
(45) Date of Patent: Jan. 12, 2016

(54) CIRCUITS FOR AND METHODS OF ENABLING THE MODIFICATION OF AN INPUT DATA STREAM

(71) Applicant: Xilinx, Inc., San Jose, CA (US)

(72) Inventors: Jay Southard, Fremont, CA (US);
Krishna Garlapati, Campbell, CA (US);
Elliott Delaye, San Jose, CA (US);
Ashish Sirasao, San Jose, CA (US);
Bing Tian, San Jose, CA (US)

(73) Assignee: XILINX, INC., San Jose, CA (US)

( * ) Notice: Subject to any disclaimer, the term of this patent is extended or adjusted under 35 U.S.C. 154(b) by 285 days.

(21) Appl. No.: 13/908,160

(22) Filed: Jun. 3, 2013

(51) Int. Cl.
*G06F 12/00* (2006.01)
(52) U.S. Cl.
CPC ...................................... *G06F 12/00* (2013.01)
(58) Field of Classification Search
CPC ............ H04N 21/4307; H04N 21/434; H04N 21/2368; G06F 12/00
USPC ........................... 711/154; 370/535, 537, 542
See application file for complete search history.

(56) References Cited

U.S. PATENT DOCUMENTS

| 7,477,072 B1 | 1/2009 | Kao et al. |
| 7,706,417 B1 * | 4/2010 | Rhodes .......................... 370/535 |
| 8,352,526 B1 | 1/2013 | Alfke |

* cited by examiner

*Primary Examiner* — Jasmine Song
(74) *Attorney, Agent, or Firm* — John J. King

(57) ABSTRACT

A circuit for enabling a modification of an input data stream is described. The circuit comprises a first plurality of registers coupled in series; an input register of the first plurality of registers coupled to receive the input data stream; an output register of the first plurality of registers positioned at an end of the first plurality of registers; and a control circuit enabling a data value which is independent of the input data stream to be generated as an output of the circuit at a predetermined time.

20 Claims, 9 Drawing Sheets

CIRCUITS FOR AND METHODS OF ENABLING THE MODIFICATION OF AN INPUT DATA STREAM

TECHNICAL FIELD

The present invention relates generally to integrated circuit devices, and in particular, to circuits for and methods of enabling the modification of an input data stream.

BACKGROUND

Data transmission is an important application of many integrated circuit devices. Data may be transmitted according to different transmission protocols, and may be transmitted as serial data or parallel data. Data may also be transmitted within a circuit between registers. On common arrangement of registers which enables the transmission of data is a shift register. A shift register is a series of registers which continuously advances bits of a data stream using a clock signal coupled to the individual registers of the shift register. Accordingly, a bit of the data stream (bitstream) which is provided to an input of the shift register will be output at the end of the shift register after a number of clock cycles corresponding to the number registers making up the shift register.

Depending upon the functionality of the circuit implementing the registers, the registers may be implemented so that data in the registers can be changed. For example, a technique is known by which additional logic functions could be added to a design to implement a shift-register with common load behavior. That is, the conventional technique transforms an original shift-register queue in which all of the registers have a common reset (or set) behavior. However, such an arrangement presents significant limitations to the functionality of the circuit.

SUMMARY

A circuit for enabling a modification of an input data stream is described. The circuit comprises a first plurality of registers coupled in series; an input register of the first plurality of registers coupled to receive the input data stream; an output register of the first plurality of registers positioned at an end of the first plurality of registers; and a control circuit enabling a data value which is independent of the input data stream to be generated as an output of the circuit at a predetermined time.

Another circuit for enabling a modification of an input data stream comprises a first plurality of registers coupled in series and extending from a data input register to a data output register, the data input register coupled to receive the input data stream; a second plurality of registers coupled in series and extending from a control input register to a control output register, the second plurality of registers generating a control signal; and a selection circuit coupled to receive an output of the data output register and a fixed value at inputs and the control signal at a control terminal.

A method of enabling a modification of an input data stream is also described. The method comprises coupling a first plurality of registers in series; receiving the input data stream at an input register of the first plurality of registers; positioning an output register of the first plurality of registers at an end of the first plurality of registers; and enabling a data value which is independent of the input data stream to be generated as an output of the circuit at a predetermined time.

DETAILED DESCRIPTION

Figure 1:
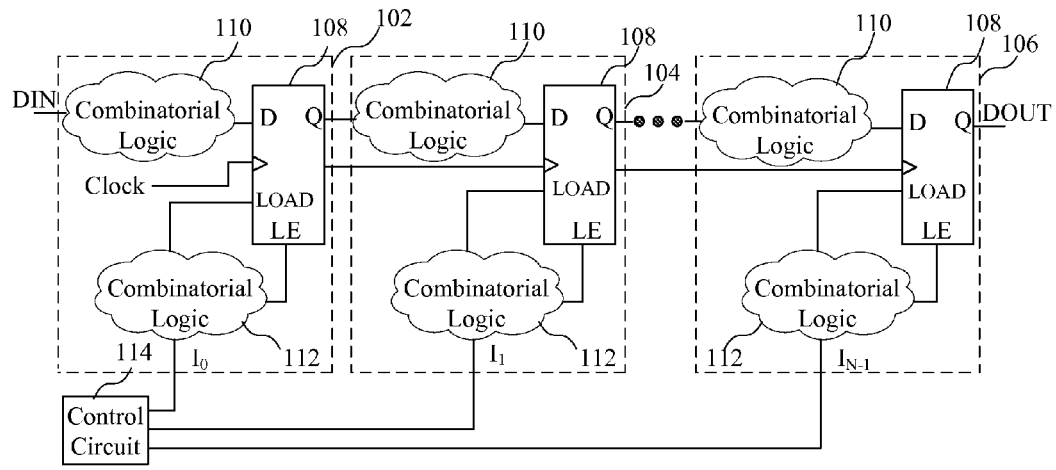
FIG. 1 is a block diagram of a circuit for enabling a modification of a bitstream.

Turning first to FIG. 1, a block diagram of a circuit for enabling a modification of a bitstream is shown. In particular, a data transmission circuit 100 comprises a plurality of stages 102-106 coupled in series for receiving an input data stream (DIN) and generating an output data stream (DOUT). Each of the stages 102-106 has a register 108 and may have combinatorial logic 110 coupled to a data input of the register. The combinatorial logic 110 may perform any desired functionality, and may be implemented using programmable resources described in more detail below in reference to FIG. 14. Combinatorial logic 112 can be positioned between a control circuit 114 and the register 108. The control circuit 114 generates control signals $I_0$-$I_{N-1}$ which are coupled to registers of corresponding stages. The combinatorial logic will generate a value which is coupled to a load (LOAD) port, as well a load control signal to a load enable (LE) port. Alternatively, either the value coupled to the load port or the load enable signal may be provide to the register 108 directly from the control circuit 114. A value provided to the load port will be generated at the Q output of the register. While combinatorial logic 110 and 112 is shown in each of the stages 102-106, it should be under stood that some stages may not have either combinatorial logic 110 or control logic 112. The control signal 114 may be implemented by a processor or programmable resources of the circuit of FIG. 14, for example.

Accordingly, the circuit arrangement of FIG. 1 enables selectively loading data at any point in group of registers coupled in series. The circuit supports the specification of a register chain in which data nominally propagates from one end to the other in pipeline fashion, but the data of each element can be independently overridden at any time. As will be described in more detail below in reference to FIG. 2, data of each element may be overridden by a load of one of a finite number of arbitrary constants.

Figure 2:
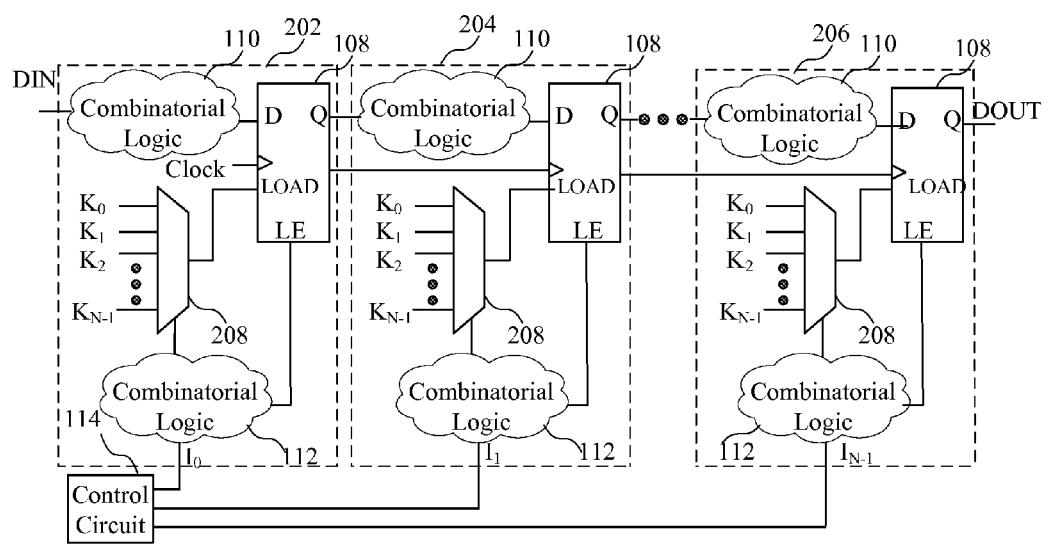
FIG. 2 is a block diagram of a circuit for enabling a modification of a bitstream having multiple initialization values.

As shown in the arrangement of FIG. 2, a data transmission circuit 200 for enabling a modification of a bitstream has multiple initialization values for each stage. In particular, each stage 202-206, in addition to the register 108 and the combinatorial logic 110 and 112, has a multiplexer 208 coupled to receive a plurality of constants. Rather than enable the limited case when there is exactly one override value of all zeros (reset) or all ones (set) which is applied to every register simultaneously, the circuit of FIG. 2 allows arbitrary override constants, and also an arbitrary number of such constants, including stages with no override constants. By way of example, the constants $K_0$-$K_{N-1}$ could be binary numbers (i.e., logical zeros and/or logical ones), where the values and the selections of the constants are selected based upon the particular application in which the data transmission circuit is implemented. The circuit arrangement of FIG. 2 supports not only arbitrary initial constant values, but also enables set/ reset/load behavior and enables both synchronous or asynchronous loadable capabilities to any pipelined logic.

Figure 3:
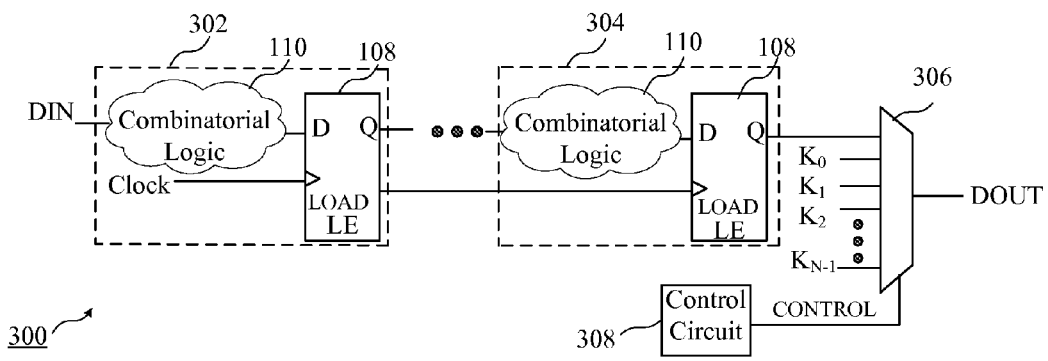
FIG. 3 is a block diagram of a circuit for enabling a modification of a bitstream at an output of a plurality of registers coupled in series.

Turning now to FIG. 3, a block diagram of a circuit for enabling a modification of a bitstream at an output of a plurality of registers coupled in series is shown. According to the data transmission circuit 300 arrangement of FIG. 3, rather than changing a value generated at some point in a plurality of registers, the output of the last register of the plurality of registers is overridden by providing a selected constant at the output in place of the output value generated at the output of the last register. In particular, the output of the last stage of a plurality of stages 302-304 is coupled to an input of a multiplexer 306 which is also coupled to receive one or a plurality of constants $K_0$-$K_{N-1}$. A control circuit 308 provides a control signal (CONTROL) to a selection input of the multiplexer 306 to select either the output of the last register of the plurality of registers, or a constant value. Accordingly, rather than selectively loading a value at a predetermined register of a plurality of registers coupled in series, the circuit arrangement of FIG. 3 enables a user to select a value other that the value generated at the output of the last register to be generated as an output of the circuit by selecting a different input to the multiplexer at a predetermined time.

Figure 4:
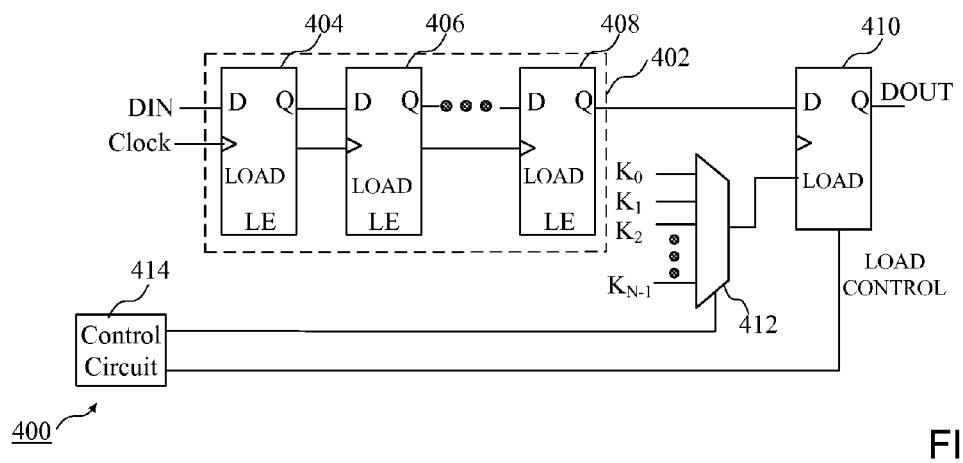
FIG. 4 is a block diagram of a circuit for enabling a modification of a bitstream coupled to a shift register.

The circuits for enabling the modification of an input data stream find particular application in shift registers, as will now be described in reference to FIGS. 4-7. As shown in FIG. 4, a block diagram of a data transmission circuit 400 for enabling a modification of a bitstream coupled to a shift register 400 is shown. In particular, a plurality of registers 402-406 of a shift register 408 is coupled in series, where a multiplexer 412 is controlled by a control circuit 414 to load an output register 410 coupled to the output of the shift register 408. Accordingly, the control circuit 414 loads a selected constant value $K_0$-$K_{N-1}$ at a predetermined time to the output register 410, thereby overriding the output data from the shift register which would be coupled to a data input of the output register 410.

Figure 5:
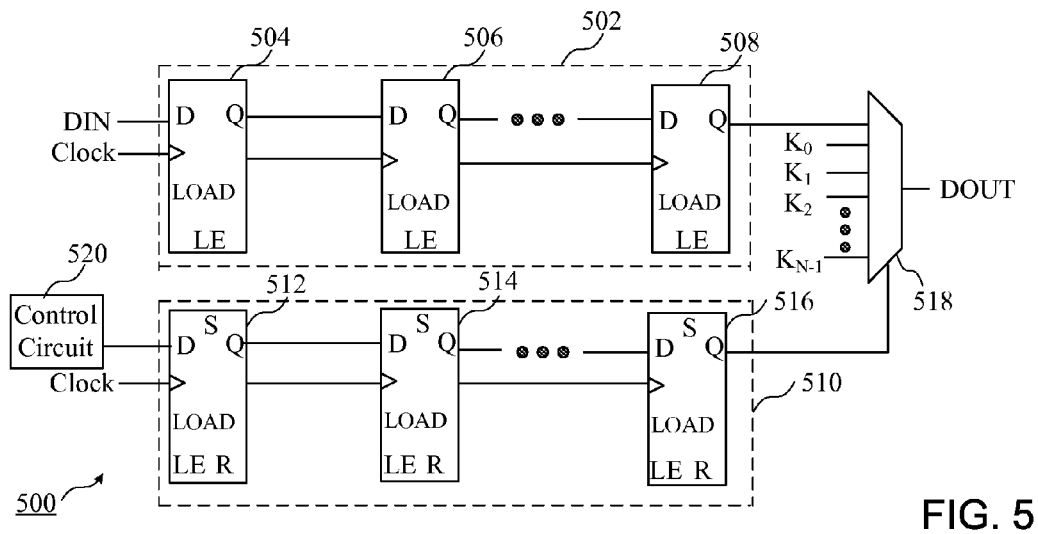
FIG. 5 is a block diagram of a circuit for enabling a modification of a bitstream coupled to a shift register having parallel paths of registers.

According to the circuit arrangements of FIGS. 5-8, rather than loading a value to a register, the output of the data transmission circuit is selected such that either the output of the last register or a constant value is selected, as set forth above in reference to FIG. 3. However, according to each of the circuit arrangements of FIGS. 5-8, a parallel control path is provided to enable the selection of the correct output of the data transmission circuit. As shown in FIG. 5, a data transmission circuit 500 comprises a data path 502 having a first plurality of registers 504-508 coupled in series and provided in parallel with a control path 510 having a second plurality of registers 512-516. The output of the control path 510 is used to control a multiplexer 518 to select either an output of the last register of the first plurality of registers, or a constant value. The number or registers of the data path 502 is preferably equal to the number of registers of the control path 510. By making the number or registers equal, the control circuit 520 can easily provide a control signal to the control path 510 at the same time that a value of the input data stream that is to be overridden is provided to the data path 502. That is, because the registers of both the data path 502 and the control path 510 are clocked by the same clock signal, a constant value selected by the control signal coupled to the multiplexer 518 can be provided to the data port of the register 512 at the same time that the data value of the input data stream which is to be overridden is provided to the data input port of the register 504. Because a multi-bit control signal is required to select one of the plurality of constant values of FIG. 5, the registers of the control path 510 are multi-bit registers.

Figure 6:
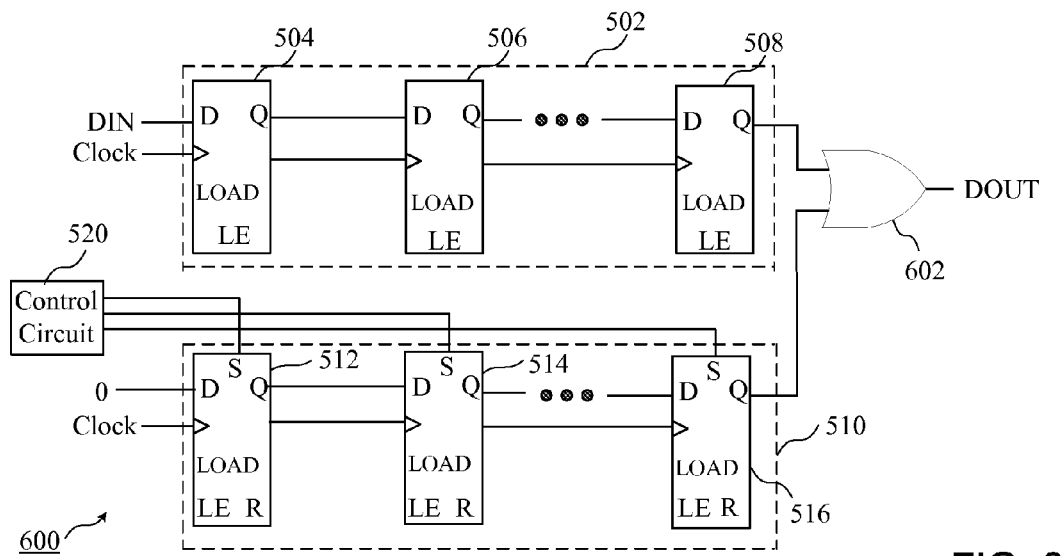
FIG. 6 is a block diagram of a circuit for enabling a modification of a bitstream coupled to a shift register having parallel paths of registers controlled by a set signal.
Figure 7:
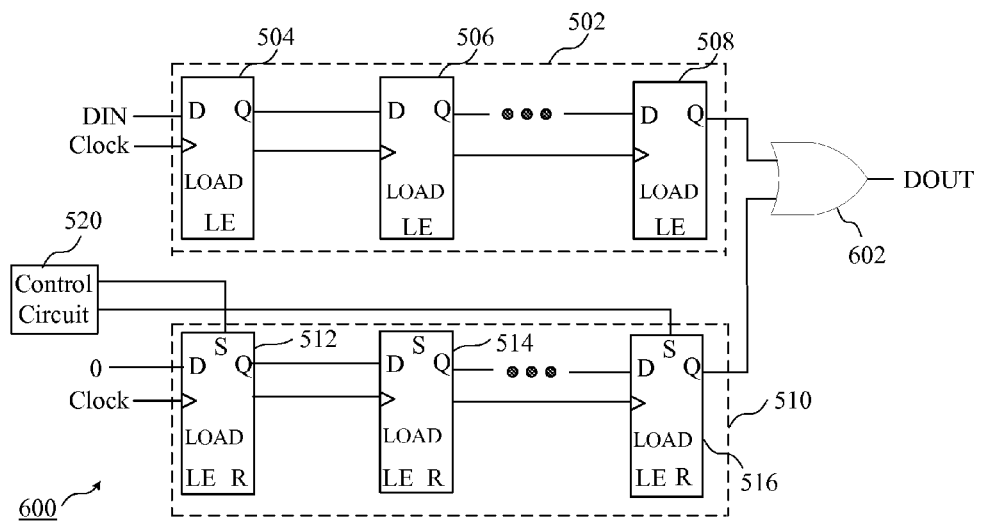
FIG. 7 is a block diagram of a circuit for enabling a modification of a bitstream coupled to a shift register having parallel paths of registers controlled by a set signal coupled to predetermined registers.

The embodiments of FIGS. 6-9 show particular applications of the circuit of FIG. 5, but using set and reset ports, respectively, of registers in the control path. As shown in FIG. 6, a data transmission circuit 600 enables a modification of a bitstream coupled to a shift register having a parallel path of registers controlled by set signals. That is, the control circuit 502 is configured to generate set (S) signals which are coupled to set ports of each register of the plurality of registers 512-516. Because a logical "0" is input to the registers of the first register 512, the logical zero will propagate through the plurality of registers and is coupled to a first input of the OR gate 602. By providing a logical zero to the OR gate, the control path 510 enables the output of the data path 502 to be passed by the OR gate 602. However, if is determined that data should be overridden with a set value, a register at some point in the series of registers of the control path will be set with a logical "1." When the logical "1" reaches the OR gate 602, the data path will be overridden and the output of the OR gate will be driven to a logical "1." As shown in FIG. 7, only predetermined registers of the series of registers of the control path are coupled to receive a reset signal.

Figure 8:
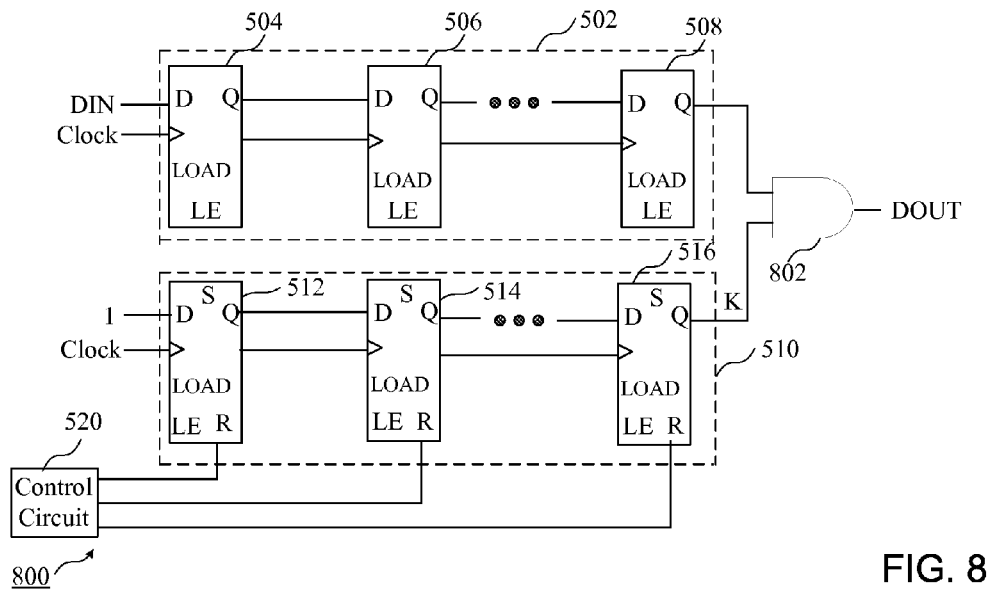
FIG. 8 is a block diagram of a circuit for enabling a modification of a bitstream coupled to a shift register having parallel paths of registers controlled by a reset signal.
Figure 9:
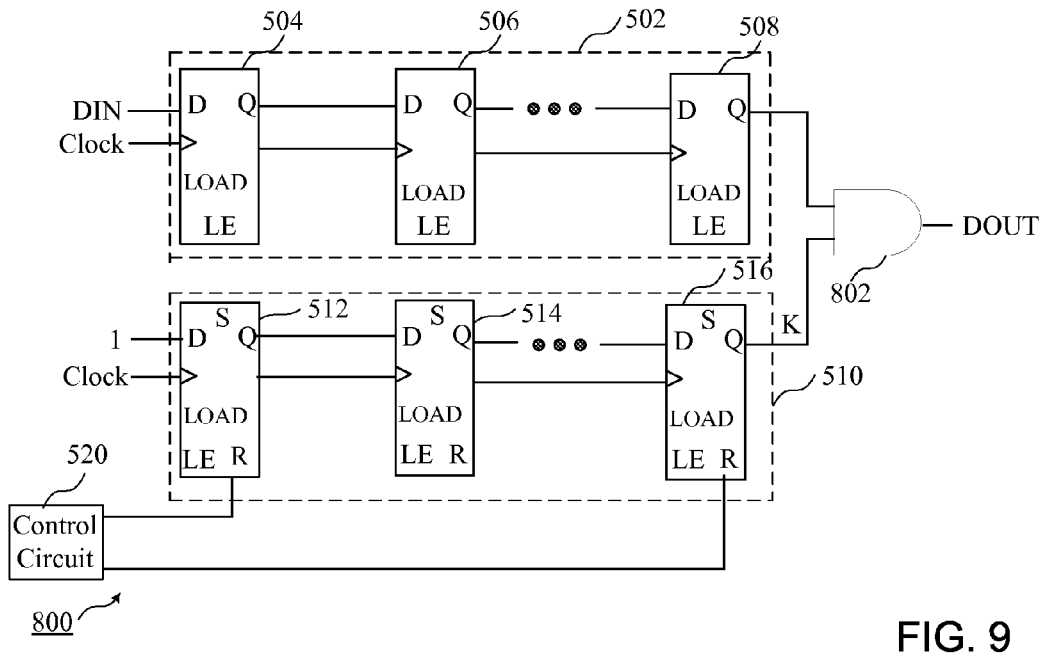
FIG. 9 is a block diagram of a circuit for enabling a modification of a bitstream coupled to a shift register having parallel paths of registers controlled by a reset signal coupled to predetermined registers.

As shown in FIG. 8, a circuit for enabling a modification of a bitstream coupled to a shift register having a parallel path of registers controlled by a reset signal is shown. Rather than using the set signal for the registers, the reset signal will enable a logical "0" to be output to an AND gate 802. While a logical "1" will normally be passed through the control path 510, a register of the plurality of registers 512-516 will be reset to generate a logical "0," causing the data path to be overridden with a reset value, and the output of the AND gate 802 to be forced to a logical zero. As shown in FIG. 9, only predetermined registers of the series of registers of the control path are coupled to receive a reset signal.

Figure 10:
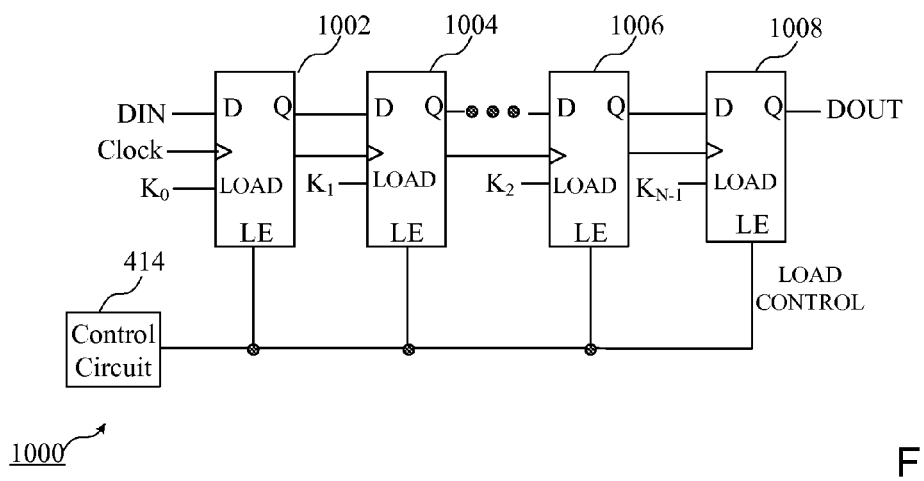
FIG. 10 is a block diagram of a circuit for enabling a modification of a bitstream coupled to a shift register having dedicated load inputs.
Figure 11:
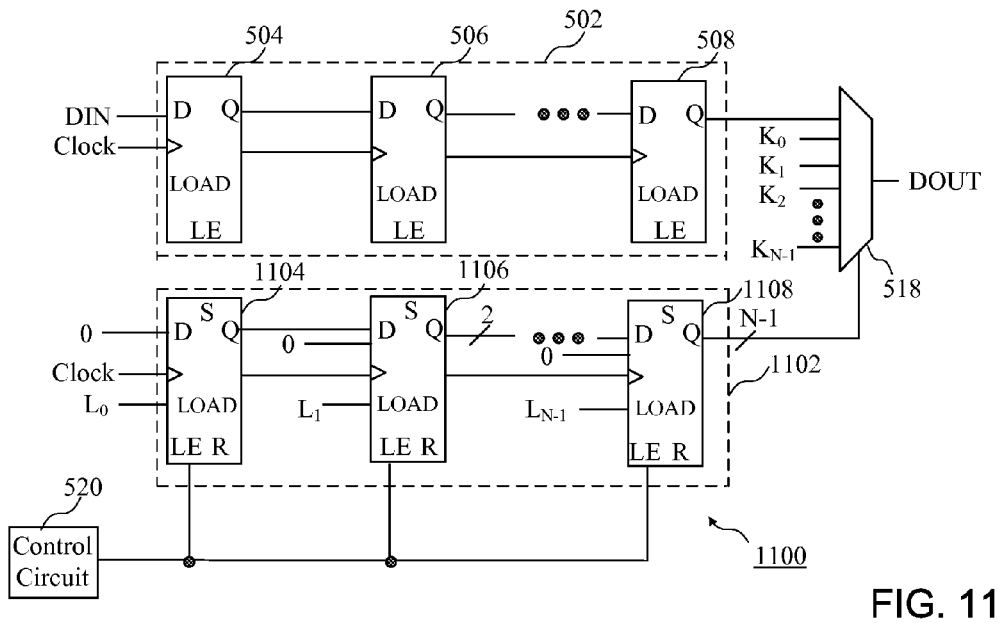
FIG. 11 is a block diagram of a circuit for enabling a modification of a bitstream coupled to a shift register having parallel paths of registers having dedicated load inputs.

Turning now to FIG. 10, a block diagram of a circuit for enabling a modification of a bitstream coupled to a shift register having dedicated load inputs is shown. In particular, a plurality of registers 1002-1008 coupled in series, where each of the registers receives a different load value as shown. While each of the registers in the circuit arrangement of FIG. 10 is be loaded with a value which will be generated at an output, the circuit arrangement of FIG. 11 enables control signals to be loaded in the parallel path 1102 of registers having dedicated load inputs. As shown in FIG. 11, each of the N registers of the parallel path 1102 receives a load value $L_0$-$L_{N-1}$, and a bit is added at the output of each of the registers. For example, after the first register, a second "0" bit is provided to the next register which generates a two bit output. Accordingly, each register of the plurality of registers of the second path generates a distinct output associated with the register such that, at the end of N registers, an N-bit output will be generated as a control signal. As can be seen, an N−1 bit is added by the end of the last stage so that either the output of the register 508, or one of the values $K_0$-$K_{N-1}$ can be selected. That is, if each bit at the output of the second path 1102 is a logical zero, the output of the register 508 is selected. Otherwise, one of the values of $K_0$-$K_{N-1}$ is selected based upon the N output bits of the register 1108.

Figure 12:
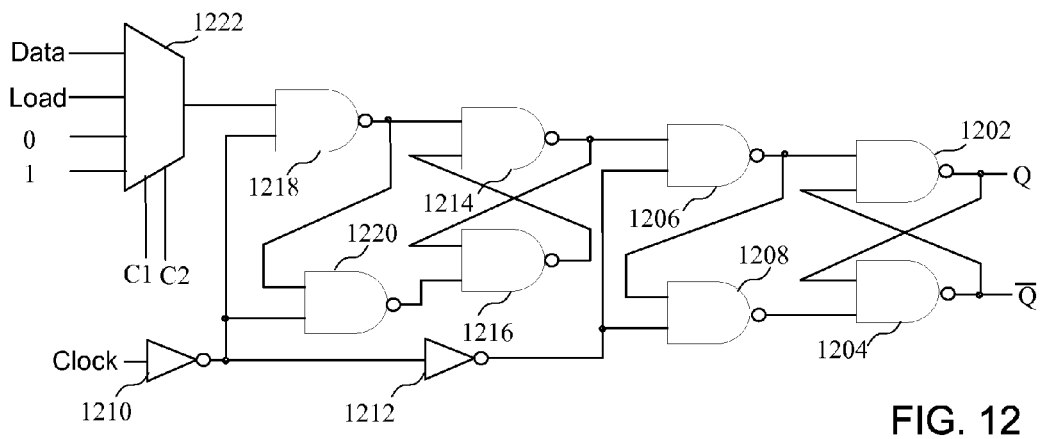
FIG. 12 is a block diagram of a register which may be implemented in FIGS. 1-11.

Turning now to FIG. 12, a block diagram of a register is shown. The register comprises a pair or cross-coupled NAND gates 1202 and 1204 receiving the outputs at first inputs and the outputs of NAND gates 1206 and 1208, respectively, at second inputs as shown. Each of the NAND gates 1206 and 1208 receives the clock signal at one input by way of a pair of inverters 1210 and 1212. The NAND gate 1208 receives an output of the NAND gate 1206 at a second input, while the NAND gate 1206 receives the output of a second stage. That is, the second stage comprises a second pair of cross-coupled NAND gates 1214 and 1216 each receiving the outputs of the other NAND gate at first inputs and the outputs of NAND gates 1218 and 1220, respectively, at second inputs as shown. Each of the NAND gates 1206 and 1208 receives an inverted clock signal at one input by way of the inverter 1210. NAND gate 1220 receives the output of the NAND gate 1218, while the NAND gate 1218 receives input data by way of a multiplexer 1222.

As can be seen, the register of FIG. 12 enables selecting one of a plurality of inputs, such as the data (DATA) of an input data stream, data to be loaded (LOAD) in place of the data stream, or a logical "1" or "0." The register of FIG. 12 could be implemented as a register in any of the circuit arrangements of FIGS. 1-11. While the multiplexer of FIG. 12 is coupled to receive four inputs and controlled by two control signals C1 and C2 for selecting one of the inputs, it should be understood that the multiplexer could receive fewer inputs depending upon the application in one of the circuits described above. For example, if the register is used to receive either the data of the data stream or a load value which overrides the data, only two inputs to the multiplexer would be required and could be controlled by a single control signal. Similarly, if the register is used to receive a set or reset value (i.e. a logical "1" or logical "0"), only two inputs to the multiplexer would be required and could also be controlled by a single control signal. Accordingly, the circuit of FIG. 12 provides a register which could be used for a variety of applications, but could be simplified to receive fewer inputs as necessary for a given application in any of the circuit arrangements of FIGS. 1-11.

Figure 13:
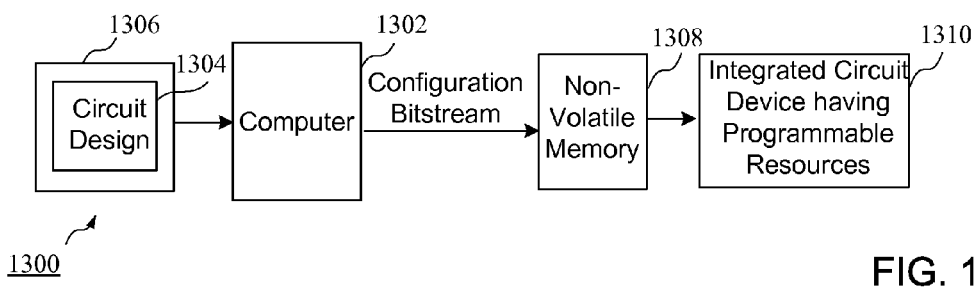
FIG. 13 is a block diagram of a system for programming a device having programmable resources.

Turning now to FIG. 13, a block diagram of a system for programming a device having programmable resources according to an embodiment is shown. In particular, a computer 1302 is coupled to receive a circuit design 1304 from a memory 1306, and generates a configuration bitstream which is stored in the non-volatile memory 1306. As will be described in more detail below, the circuit design may be a high level design, such as a circuit design defined in a hardware description language (HDL). Also, the computer may be configured to run software that generates a configuration bitstream which is stored in the non-volatile memory 1308 and provided to an integrated circuit 1310 which may be a programmable integrated circuit, such as the integrated circuit described below in FIG. 14. As will be described in more detail below, bit of the configuration bitstream are used to configure programmable resources of the integrated circuit.

Figure 14:
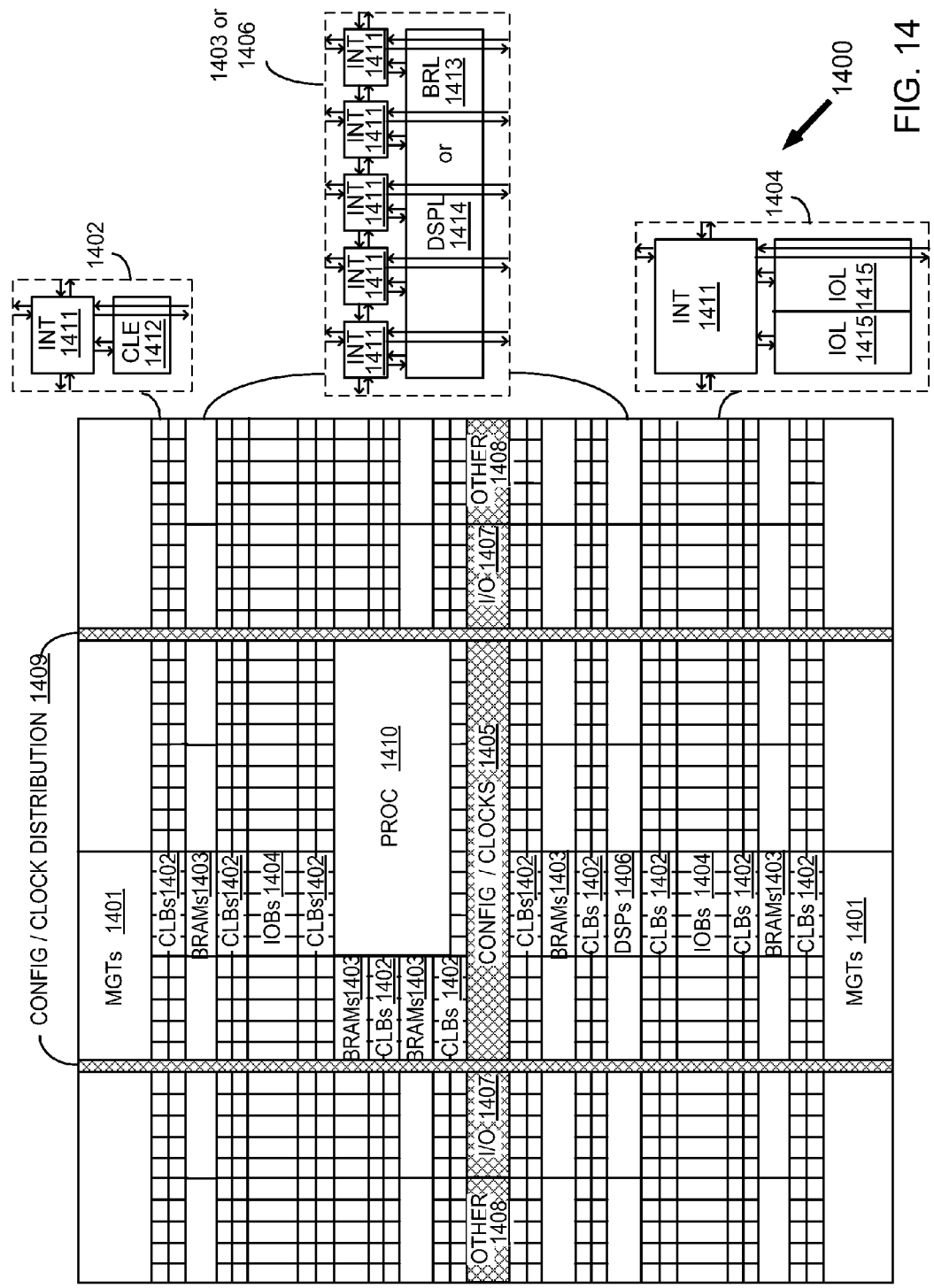
FIG. 14 is a block diagram of a device having programmable resources which may implement the circuits of FIGS. 1-13.

Turning now to FIG. 14, a block diagram of an exemplary device having programmable resources including the circuits of FIGS. 1-12 is shown. While devices having programmable resources may be implemented in any type of integrated circuit device, such as an application specific integrated circuit (ASIC) having programmable resources, other devices comprise dedicated programmable logic devices (PLDs). One type of PLD is the Complex Programmable Logic Device (CPLD). A CPLD includes two or more "function blocks" connected together and to input/output (I/O) resources by an interconnect switch matrix. Each function block of the CPLD includes a two-level AND/OR structure similar to that used in a Programmable Logic Array (PLA) or a Programmable Array Logic (PAL) device. Another type of PLD is a field programmable gate array (FPGA). In a typical FPGA, an array of configurable logic blocks (CLBs) is coupled to programmable input/output blocks (IOBs). The CLBs and IOBs are interconnected by a hierarchy of programmable routing resources. These CLBs, IOBs, and programmable routing resources are customized by loading a configuration bitstream, typically from off-chip memory, into configuration memory cells of the FPGA. For both of these types of programmable logic devices, the functionality of the device is controlled by configuration data bits of a configuration bitstream provided to the device for that purpose. The configuration data bits may be stored in volatile memory (e.g., static memory cells, as in FPGAs and some CPLDs), in non-volatile memory (e.g., Flash memory, as in some CPLDs), or in any other type of memory cell.

The device of FIG. 14 comprises an FPGA architecture 1000 having a large number of different programmable tiles including multi-gigabit transceivers (MGTs) 1401, CLBs 1402, random access memory blocks (BRAMs) 1403, input/output blocks (IOBs) 1404, configuration and clocking logic (CONFIG/CLOCKS) 1405, digital signal processing blocks (DSPs) 1406, specialized input/output blocks (I/O) 1407 (e.g., configuration ports and clock ports), and other programmable logic 1408 such as digital clock managers, analog-to-digital converters, system monitoring logic, and so forth. Some FPGAs also include dedicated processor blocks (PROC) 1410, which may be used to implement a software application, for example.

In some FPGAs, each programmable tile includes a programmable interconnect element (INT) 1411 having standardized connections to and from a corresponding interconnect element in each adjacent tile. Therefore, the programmable interconnect elements taken together implement the programmable interconnect structure for the illustrated FPGA. The programmable interconnect element 1411 also includes the connections to and from the programmable logic element within the same tile, as shown by the examples included at the top of FIG. 14.

For example, a CLB 1402 may include a configurable logic element (CLE) 1412 that may be programmed to implement user logic plus a single programmable interconnect element 1411. A BRAM 1403 may include a BRAM logic element (BRL) 1413 in addition to one or more programmable interconnect elements. The BRAM includes dedicated memory separate from the distributed RAM of a configuration logic block. Typically, the number of interconnect elements included in a tile depends on the height of the tile. In the pictured embodiment, a BRAM tile has the same height as five CLBs, but other numbers may also be used. A DSP tile 1406 may include a DSP logic element (DSPL) 1414 in addition to an appropriate number of programmable interconnect elements. An IOB 1404 may include, for example, two instances of an input/output logic element (IOL) 1415 in addition to one instance of the programmable interconnect element 1411. The location of connections of the device is controlled by configuration data bits of a configuration bitstream provided to the device for that purpose. The programmable interconnects, in response to bits of a configuration bitstream, enable connections comprising interconnect lines to be used to couple the various signals to the circuits implemented in programmable logic, or other circuits such as BRAMs or the processor.

In the pictured embodiment, a columnar area near the center of the die is used for configuration, clock, and other control logic. The config/clock distribution regions 1409 extending from this column are used to distribute the clocks and configuration signals across the breadth of the FPGA. Some FPGAs utilizing the architecture illustrated in FIG. 14 include additional logic blocks that disrupt the regular columnar structure making up a large part of the FPGA. The additional logic blocks may be programmable blocks and/or dedicated logic. For example, the processor block PROC 1410 shown in FIG. 14 spans several columns of CLBs and BRAMs.

Note that FIG. 14 is intended to illustrate only an exemplary FPGA architecture. The numbers of logic blocks in a column, the relative widths of the columns, the number and order of columns, the types of logic blocks included in the columns, the relative sizes of the logic blocks, and the interconnect/logic implementations included at the top of FIG. 14 are purely exemplary. For example, in an actual FPGA more than one adjacent column of CLBs is typically included wherever the CLBs appear in order to facilitate the efficient implementation of user logic. While the embodiment of FIG. 14 relates to an integrated circuit having programmable resources, it should be understood that the circuits and methods set forth in more detail below could be implemented in any type of ASIC.

Figure 15:
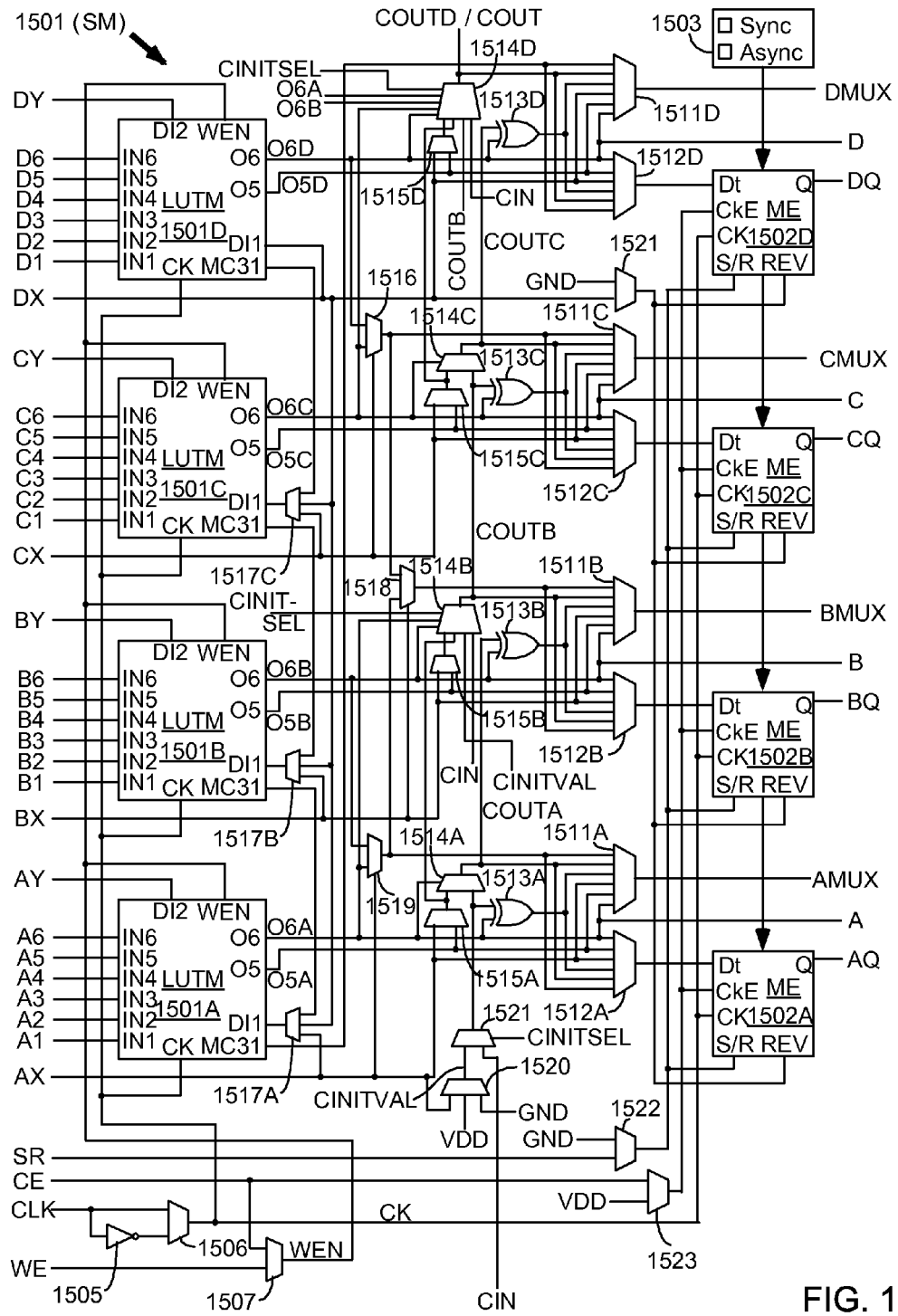
FIG. 15 is a block diagram of a configurable logic element of the device of FIG. 14.

Turning now to FIG. 15, block diagram of a configurable logic element of the device of FIG. 14 is shown. In particular, FIG. 15 illustrates in simplified form a configurable logic element of a configuration logic block 1402 of FIG. 14. In the embodiment of FIG. 15, slice M 1501 includes four lookup tables (LUTMs) 1501A-1501D, each driven by six LUT data input terminals A1-A6, B1-B6, C1-C6, and D1-D6 and each providing two LUT output signals O5 and O6. The O6 output terminals from LUTs 1501A-1501D drive slice output terminals A-D, respectively. The LUT data input signals are supplied by the FPGA interconnect structure via input multiplexers, which may be implemented by programmable interconnect element 1511, and the LUT output signals are also supplied to the interconnect structure. Slice M also includes: output select multiplexers 1511A-1511D driving output terminals AMUX-DMUX; multiplexers 1512A-1512D driving the data input terminals of memory elements 1502A-1502D; combinational multiplexers 1516, 1518, and 1519; bounce multiplexer circuits 1522-1523; a circuit represented by inverter 1505 and multiplexer 1506 (which together provide an optional inversion on the input clock path); and carry logic having multiplexers 1514A-1514D, 1515A-1515D, 1520-1521 and exclusive OR gates 1513A-1513D. All of these elements are coupled together as shown in FIG. 15. Where select inputs are not shown for the multiplexers illustrated in FIG. 15, the select inputs are controlled by configuration memory cells. That is, configuration bits of the configuration bitstream stored in configuration memory cells are coupled to the select inputs of the multiplexers to select the correct inputs to the multiplexers. These configuration memory cells, which are well known, are omitted from FIG. 15 for clarity, as well as from other selected figures herein.

In the pictured embodiment, each memory element 1502A-1502D may be programmed to function as a synchronous or asynchronous flip-flop or latch. The selection between synchronous and asynchronous functionality is made for all four memory elements in a slice by programming Sync/Asynch selection circuit 1503. When a memory element is programmed so that the S/R (set/reset) input signal provides a set function, the REV input terminal provides the reset function. When the memory element is programmed so that the S/R input signal provides a reset function, the REV input terminal provides the set function. Memory elements 1502A-1502D are clocked by a clock signal CK, which may be provided by a global clock network or by the interconnect structure, for example. Such programmable memory elements are well known in the art of FPGA design. Each memory element 1502A-1502D provides a registered output signal AQ-DQ to the interconnect structure. Because each LUT 1501A-1501D provides two output signals, O5 and O6, the LUT may be configured to function as two 5-input LUTs with five shared input signals (IN1-IN5), or as one 6-input LUT having input signals IN1-IN6.

In the embodiment of FIG. 15, each LUTM 1501A-1501D may function in any of several modes. When in lookup table mode, each LUT has six data input signals IN1-IN6 that are supplied by the FPGA interconnect structure via input multiplexers. One of 64 data values is programmably selected from configuration memory cells based on the values of signals IN1-IN6. When in RAM mode, each LUT functions as a single 64-bit RAM or two 32-bit RAMs with shared addressing. The RAM write data is supplied to the 64-bit RAM via input terminal DI1 (via multiplexers 1517A-1517C for LUTs 1501A-1501C), or to the two 32-bit RAMs via input terminals DI1 and DI2. RAM write operations in the LUT RAMs are controlled by clock signal CK from multiplexer 1506 and by write enable signal WEN from multiplexer 1507, which may selectively pass either the clock enable signal CE or the write enable signal WE. In shift register mode, each LUT functions as two 16-bit shift registers, or with the two 16-bit shift registers coupled in series to create a single 32-bit shift register. The shift-in signals are provided via one or both of input terminals DI1 and DI2. The 16-bit and 32-bit shift out signals may be provided through the LUT output terminals, and the 32-bit shift out signal may also be provided more directly via LUT output terminal MC31. The 32-bit shift out signal MC31 of LUT 1501A may also be provided to the general interconnect structure for shift register chaining, via output select multiplexer 1511D and CLE output terminal DMUX. Accordingly, the circuits and methods set forth above may be implemented in a device such as the devices of FIGS. 14 and 15, or any other suitable device.

Figure 16:
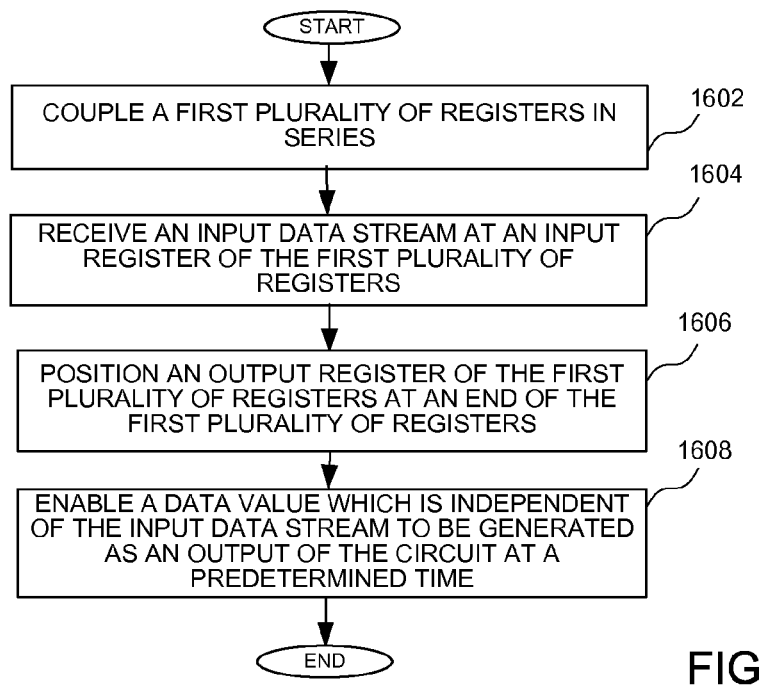
FIG. 16 is a flow chart showing a method of enabling a modification of an input data stream.

Turning now to FIG. 16, a flow chart shows a method of enabling a modification of an input data stream. In particular, a first plurality of registers is coupled in series at a block 1602. An input data stream is received at an input register of the first plurality of registers at a block 1604. An output register of the first plurality of registers is positioned at an end of the first plurality of registers at a block 1606. A data value which is independent of the input data stream is generated as an output of the circuit at a predetermined time at a block 1608.

Figure 17:
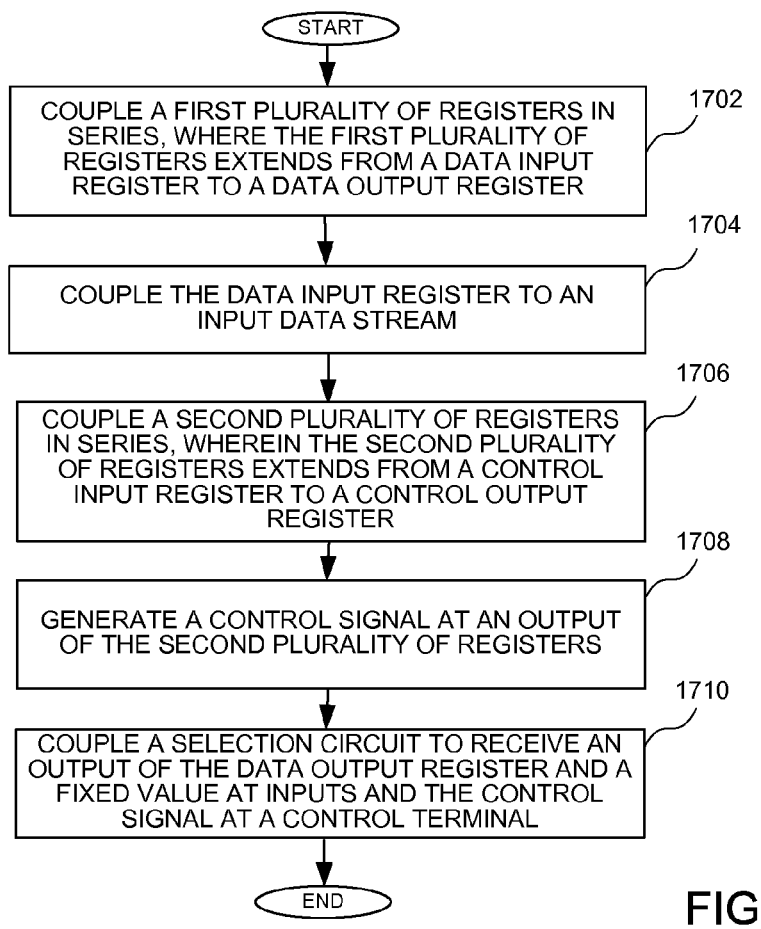
FIG. 17 is a flow chart showing another method of enabling a modification of an input data stream.

Turning now to FIG. 17, a flow chart shows another method of enabling a modification of an input data stream. A first plurality of registers is coupled in series, where the first plurality of registers extends from a data input register to a data output register at a block 1702. The data input register is coupled to an input data stream at a block 1704. A second plurality of registers is coupled in series, wherein the second plurality of registers extends from a control input register to a control output register at a block 1706. A control signal generated at an output of the second plurality of registers at a block 1708. A selection circuit is coupled to receive an output of the data output register and a fixed value at inputs and the control signal at a control terminal at a block 1710.

The various elements of the method of FIGS. 16 and 17 may be implemented using the circuits of FIGS. 1-15 as described, or using some other suitable circuits. While specific elements of the method are described, it should be understood that additional elements of the method, or additional details related to the elements, could be implemented according to the disclosure of FIGS. 1-15.

It can therefore be appreciated that a new circuit for and method of enabling a modification of an input data stream have been described. It will be appreciated by those skilled in the art that numerous alternatives and equivalents will be seen to exist which incorporate the disclosed invention. As a result, the invention is not to be limited by the foregoing embodiments, but only by the following claims.

What is claimed is:

1. A circuit for enabling a modification of a data stream, the circuit comprising:
 a first plurality of registers coupled in series;
 an input register of the first plurality of registers coupled to receive an input data stream;
 an output register of the first plurality of registers positioned at an end of the first plurality of registers; and
 a control circuit for providing a data value which is independent of the input data stream at an input of a register of the plurality of registers and generated at an output of the register at a predetermined time;
 wherein the control circuit enables a modification of an output data stream generated at an output of the first plurality of registers by providing the data value which is independent of the input data stream at the input of the register.

2. The circuit of claim 1, further comprising a selection circuit coupled to receive a fixed data value and an output of the output register, wherein a control signal coupled to a control terminal of the selection circuit enables the selection of the fixed data value or the output of the output register.

3. The circuit of claim 2, further comprising a second plurality of registers coupled in series, wherein the control signal is an output of the second plurality of register.

4. The circuit of claim 1, further comprising, for each register of the first plurality of registers, a selection circuit coupled to a load input of the register.

5. The circuit of claim 4, wherein the selection circuit is coupled to receive a plurality of fixed inputs.

6. The circuit of claim 4, wherein the control circuit is coupled to a control terminal of the selection circuit and a load enable input of the register.

7. The circuit of claim 1, where the registers of the first plurality of registers are separated by combinatorial logic.

8. A circuit for enabling a modification of a data stream, the circuit comprising:
 a first plurality of registers coupled in series and extending from a data input register to a data output register, the data input register coupled to receive an input data stream;
 a second plurality of registers coupled in series and extending from a control input register to a control output register, the second plurality of registers generating a control signal; and
 a selection circuit coupled to receive an output of the data output register and a fixed value at inputs and the control signal at a control terminal.

9. The circuit of claim 8, wherein the first plurality of registers comprises a shift register.

10. The circuit of claim 8, wherein the selection circuit comprises a multiplexer coupled to receive the output of the data output register and the fixed value at inputs and the control signal at the control terminal.

11. The circuit of claim 8, further comprising a control circuit coupled to predetermined registers of the second plurality of registers.

12. The circuit of claim 8, wherein a number of registers of the first plurality of registers is equal to a number of registers of the second plurality of registers.

13. The circuit of claim 8, further comprising a control circuit coupled to generate a value at a control input of the first control register, wherein the value at the control input enables latching a fixed value provided at a data input of the first control register.

14. The circuit of claim 13, wherein each register of the second plurality of registers generates a distinct output associated with the register.

15. A method of enabling a modification of a data stream, the method comprising:
 coupling a first plurality of registers in series;
 receiving the input data stream at an input register of the first plurality of registers;
 positioning an output register of the first plurality of registers at an end of the first plurality of registers; and
 receiving a data value which is independent of the input data stream at an input of a register of the plurality of registers and which is generated at an output of the register at a predetermined time;
 wherein an output data stream generated at an output of the first plurality of registers is modified by the data value, which is independent of the input data stream, received at the input of the register.

16. The method of claim 15, further comprising coupling a selection circuit to receive a fixed data value and an output of the output register, wherein a control signal coupled to a control terminal of the selection circuit enables the selection of the fixed data value or the output of the output register.

17. The method of claim 16, further comprising coupling a second plurality of registers in series, wherein the control signal is an output of the second plurality of register.

18. The method of claim 15, further comprising coupling, for each register of the first plurality of registers, a selection circuit to a load input of the register.

19. The method of claim 18, further comprising coupling a plurality of fixed inputs to the selection circuit.

20. The method of claim 19, further comprising coupling a control circuit to a control terminal of the selection circuit and a load enable input of the register.

* * * * *